United States Patent
Hamada

[11] Patent Number: 5,912,483
[45] Date of Patent: *Jun. 15, 1999

[54] OUTPUT CIRCUIT PROVIDED WITH SOURCE FOLLOWER CIRCUIT HAVING DEPLETION TYPE MOS TRANSISTOR

[75] Inventor: Minoru Hamada, Ogaki, Japan

[73] Assignee: Sanyo Electric Company, Ltd., Osaka, Japan

[ * ] Notice: This patent is subject to a terminal disclaimer.

[21] Appl. No.: 08/847,675

[22] Filed: Apr. 28, 1997

Related U.S. Application Data

[63] Continuation of application No. 08/491,504, Jun. 16, 1995, Pat. No. 5,646,428.

[51] Int. Cl.$^6$ ................................................. H01L 29/78
[52] U.S. Cl. ...................... 257/239; 257/316; 257/291; 257/402; 257/403
[58] Field of Search ........................... 257/239, 316, 257/291, 402, 403, 390–393

[56] References Cited

U.S. PATENT DOCUMENTS

| | | | |
|---|---|---|---|
| 4,527,255 | 7/1985 | Keshtbod | 257/316 |
| 4,830,974 | 5/1989 | Chang et al. | 437/34 |
| 4,984,045 | 1/1991 | Matsunaga | 357/24 |
| 5,262,987 | 11/1993 | Kojima | 365/185 |
| 5,422,844 | 6/1995 | Wolstenholme et al. | 257/402 |
| 5,438,211 | 8/1995 | Nakamura et al. | 257/239 |
| 5,488,245 | 1/1996 | Shimizu et al. | 257/316 |
| 5,677,876 | 10/1997 | Tanaka | 257/316 |

FOREIGN PATENT DOCUMENTS

| | | | |
|---|---|---|---|
| 0072082 | 5/1980 | Japan | 257/316 |
| 62-049669 | 3/1987 | Japan | 257/316 |
| 0179273 | 6/1992 | Japan | 257/316 |
| 0110108 | 4/1993 | Japan | 257/316 |

*Primary Examiner*—David B. Hardy
*Attorney, Agent, or Firm*—Sheridan Ross P.C.

[57] ABSTRACT

A depletion type transistor formed on a semiconductor substrate includes a drain region and a source region formed in distinct areas on the substrate. An inversion layer is formed in the surface area between the drain and the source regions. The transistor further includes two insulated gates: a floating gate located above the substrate and insulated from the inversion layer by an insulating layer in such a way as to cover the inversion layer, and a control gate provided above the floating gate and insulated from the floating gate by the insulating layer.

13 Claims, 2 Drawing Sheets

5,912,483

OUTPUT CIRCUIT PROVIDED WITH SOURCE FOLLOWER CIRCUIT HAVING DEPLETION TYPE MOS TRANSISTOR

This application is a continuation application of application Ser. No. 08/491,504 filed on Jun. 16, 1995, now U.S. Pat. No. 5,646,428.

BACKGROUND OF THE INVENTION

1. Field of the Invention

The present invention relates to semiconductor devices, and in particular, a depletion type transistor having an insulated gate and its application to a solid state image pickup device.

2. Description of the Related Art

The choice of transistors for semiconductor device fabrication depends in part on the size of a particular transistor, as well as on the noise the transistor exhibits during its operation. For many applications, circuit designers prefer enhancement type MOS transistors over bipolar transistors due to the relatively small footprint of the MOS transistor compared with the bipolar transistor. Of the two transistor types, MOS transistors can be more densely integrated on a single semiconductor device than can bipolar transistors.

One typical use of enhancement type MOS transistors is as a switching element in various types of digital devices such as semiconductor memories. Another application of enhancement type MOS transistors is for analog control over the amount of transistor current flow, as for example through adjacent bipolar transistors. However, since enhancement type MOS transistors are formed with a channel near the surface of their silicon substrate, they are likely to generate more noise than bipolar transistors. Consequently, enhancement type MOS transistors exhibit a reduced signal-to-noise ratio (S/N ratio) when compared with bipolar transistors. To avoid this noise problem, circuit designers have begun to use depletion type MOS transistors for analog current control.

A depletion type MOS transistor is characterized by an inversion layer formed in the channel between its source and drain. For example, with an N type impurity like phosphorus or arsenic doped in the channel between the source and drain of an N channel MOS transistor, an N type inversion layer would be formed in the channel. This type of transistor is known as a buried channel type or depletion type N channel MOS transistor (hereinafter called DpNMOS transistor). In a DpNMOS transistor, current flows at a level deeper than the surface of the channel. This reduces the signal noise (i.e., increases the S/N ratio), making the DpNMOS an ideal choice for analog transistor current control. Alternatively, if a P type impurity such as boron were to be doped in the channel of a P channel MOS transistor, a P type inversion layer would be formed in the channel, making the device a depletion type PMOS transistor.

Generally, DpNMOS transistors function in response to a negative voltage applied to their gates. Consequently, using a DpNMOS transistor to replace an enhancement type NMOS transistor would require a circuit that converts the positive voltage, applied at the gate of the enhancement type NMOS transistor, into a negative voltage. Such a circuit would, moreover, have to serve as a negative power supply for the DpNMOS transistor. These requirements, unfortunately, complicate and enlarge the overall structure of integrated circuitry.

SUMMARY OF THE INVENTION

Accordingly, it is a primary objective of the present invention to provide an improved depletion type transistor capable of operating at reduced noise levels while permitting the analog control of current flow through the transistor.

It is a secondary objective of this invention to provide a solid state image pickup device whose output circuit incorporates this type of improved depletion type transistor.

To achieve the foregoing and other objects and in accordance with the purpose of the present invention, an improved depletion type transistor is provided.

The transistor according to the present invention is formed on a semiconductor substrate. A drain and a source of the transistor are formed apart from each other on one surface of the semiconductor substrate. An inversion layer is formed in the surface area of the semiconductor substrate between the drain and the source. A floating gate, provided via an insulating layer above the semiconductor substrate, covers the inversion layer. A control gate is provided adjacent to the insulating layer above the floating gate. The threshold voltage of the transistor is designed to vary with the amount of electrical charge accumulated in the floating gate.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
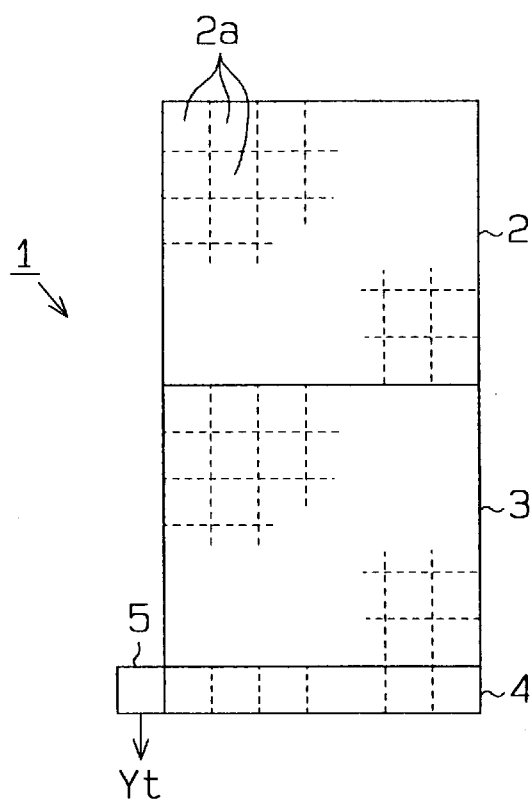
FIG. 1 is an exemplary diagram of a solid state image pickup device according to an embodiment of the present invention.

An embodiment of the present invention will now be described with reference to FIGS. 1–5. FIG. 3 shows the cross section of a depletion type N channel MOS (DpNMOS) transistor TR1 according to this embodiment. A P type well 22 is formed in the upper area of an N type silicon substrate 21 by doping that area with a P type impurity such as boron, for example. An N type drain region 23 and an N type source region 24 are formed in the P type well 22 by doping the source region 23 with an N type impurity like, for example, phosphorous. An N type impurity is doped in the channel between the drain region 23 and the source region 24. This forms an inversion layer 25 in the channel. According to this embodiment, equal concentrations of the N type impurity are doped in the drain region 23 and the source region 24. The concentration of the N type impurity in the inversion layer 25, however, is lower than it is in the regions 23 and 24.

A floating gate 27, formed above the channel, is encased by an oxidation film 26. The floating gate 27 is arranged with one end located above the drain region 23 and the other end located above the source region 24. A control gate 28, located above the floating gate 27, is also provided within the oxidation film 26. In this embodiment, the area of the control gate 28 is equal to the area of the floating gate 27. Consequently, the DpNMOS transistor TR1 functions as an insulated gate type transistor.

When a voltage is applied between the drain 23 and the source 24, hot electrons are produced in the drain region 23. The acceleration level of these hot electrons permit them to penetrate the oxidation film 26 and enter the floating gate 27. Since the floating gate 27 is insulated from the outside by the oxidation film 26, electrons accumulate in the floating gate 27.

Figure 4:
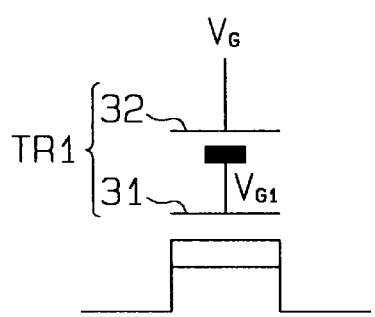
FIG. 4 is an equivalent circuit diagram of the transistor shown in FIG. 3.
Figure 5:
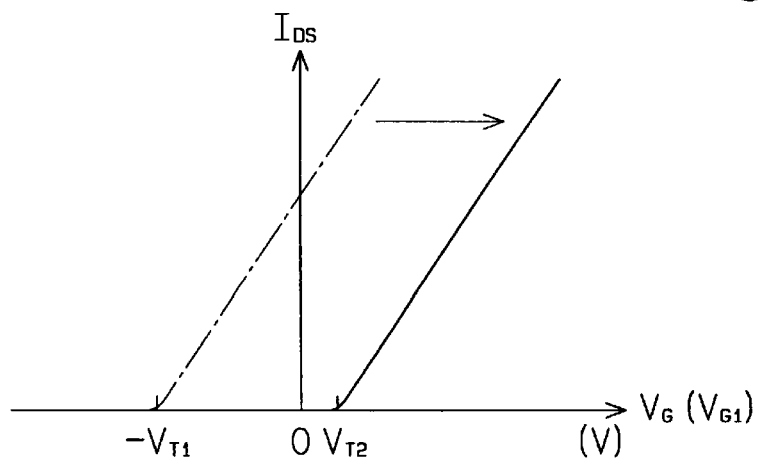
FIG. 5 is a graph illustrating threshold voltage and current characteristics of the N channel MOS transistor shown in FIG. 3.

FIG. 4 shows an equivalent circuit diagram of the DpN-MOS transistor TR1 with a charged floating gate 27. As illustrated, the DpNMOS transistor TR1 is equivalent to a circuit which comprises a depletion type N channel MOS transistor 31. The transistor 31 is designed with a monolayer gate structure, and includes a voltage source 32 capable of producing a predetermined potential difference across its positive and negative terminals. The gate of the transistor 31 is connected to the voltage source 32. The negative voltage, i.e., the potential difference $V_{32}$ across the negative terminal and positive terminal of the voltage source 32, varies with the charge accumulated on the floating gate 27.

With a sufficiently charged floating gate 27, the potential difference $V_{32}$ across the terminals of the voltage source 32 is set greater than the absolute value of the negative threshold voltage $V_{T1}$ of the transistor 31. Consequently, current flows through the DpMOS 31 when the potential at its gate $V_{G1}$ reaches the source potential (normally at ground) minus the voltage $V_{T1}$. For the DpNMOS transistor TR1, as shown in FIG. 4, the potential at the negative terminal of the voltage source 32 equals the gate potential of the transistor 31. The potential difference $V_{32}$ is greater than the value $V_{T1}$, allowing the threshold voltage $V_{T2}$ of the transistor TR1 to become positive. That is, current will flow across the drain and source of the DpNMOS transistor TR1 when its gate potential $V_G$ is higher than the source potential by an amount equal to $V_{32}-V_{T1}$.

When the floating gate 27 is uncharged, the threshold voltage of the DpNMOS transistor TR1 equals the threshold voltage $V_{T1}$ of the transistor 31. As indicated by the one dot chain line in FIG. 5, the threshold voltage $V_{T1}$ is negative. When the floating gate 27 is charged, on the other hand, the threshold voltage of the DpNMOS transistor TR1, $V_{T2}$, becomes positive, as indicated by the solid line in FIG. 5. Should the DpNMOS transistor TR1 have a charged floating gate 27, the transistor would turn on either with a positive voltage applied at its gate, or with a voltage supplied to its gate having the same polarity as the gate control voltage enabling operation of the enhancement type NMOS transistor. This allows the DpNMOS transistor TR1 of this embodiment to be used in place of an enhancement type NMOS transistor. When the DpNMOS transistor turns on, current flows significantly below the surface portion of the channel. This suppresses noise generation, and distinguishes the transistor of the present invention from that of an enhancement type NMOS transistor.

A description will now be given of a solid state image pickup device formed using charge coupled device (CCD) technology, incorporating the above described DpNMOS transistors. FIG. 1 illustrates one example of a frame transfer type CCD solid state image pickup device. An image pickup device 1 includes an image sensing section 2, a charge accumulating section 3, a horizontal transfer section 4 and an output circuit section 5.

The image sensing section 2 includes a plurality of light receiving pixels 2a arranged in a two-dimensional form. Each pixel 2a forms a photosensor, which generates signal charges (information charges) based on a sensed image. One screen of video information is acquired from the information charges output, by all of the light receiving pixels. Next, one screen of information charges is transferred in parallel from the image sensing section 2 to the charge accumulating section 3, where it is temporarily stored. Next, a horizontal line of pixel information charges are transferred to the horizontal transfer section 4 and to the output circuit section 5, pixel by pixel. Every time the output circuit section 5 receives information charges corresponding to a single pixel, it outputs a video signal Yt at a potential corresponding to the amount of information charges received.

Figure 2:
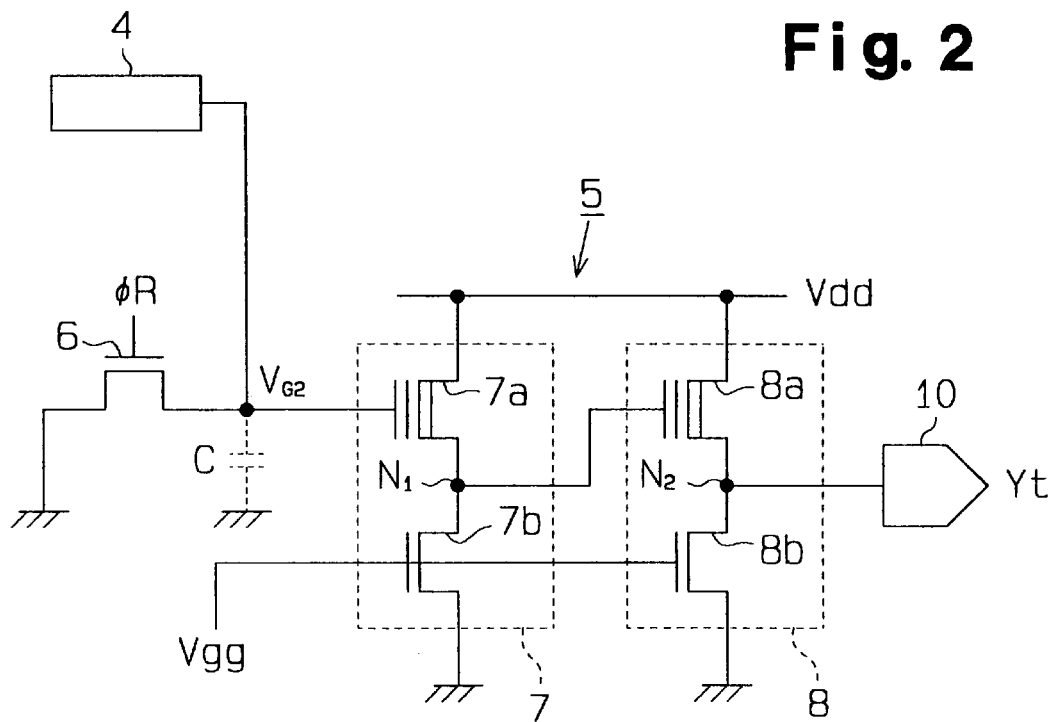
FIG. 2 is a circuit diagram of an output circuit of the image pickup device shown in FIG. 1.
Figure 3:
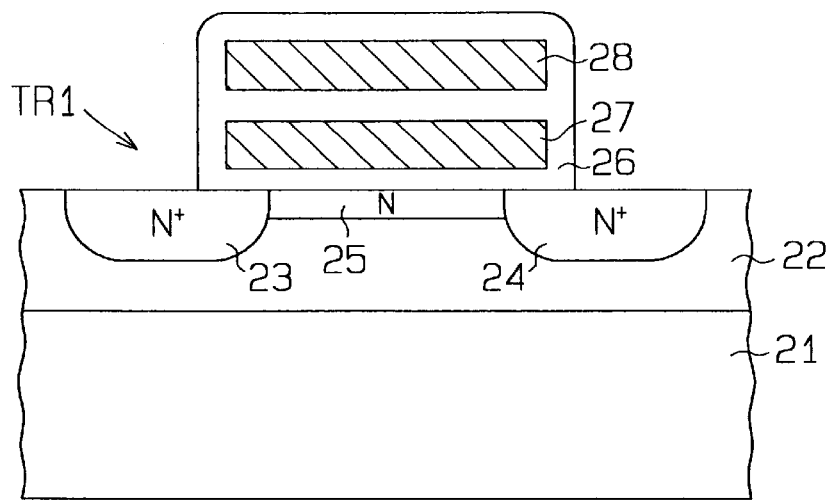
FIG. 3 is a cross-sectional view of a depletion type N channel MOS transistor according to the present invention.

FIG. 2 illustrates, one configuration of the output circuit section 5, according to one embodiment of the present invention. The output circuit section 5 includes an enhancement type MOS transistor 6 serving as a reset transistor, and two stages of source follower output circuits 7 and 8.

The reset transistor 6 has a source connected to the horizontal transfer section 4 to receive and temporarily store the information charges provided from the horizontal transfer section 4. The source of the reset transistor 6 is also connected to the output circuits 7 and 8. Those output circuits 7 and 8 in effect form a converter. The voltage produced by the converter is provided as the video signal Yt.

The reset transistor 6 includes a grounded drain (a reset drain). The gate of the reset transistor 6 is supplied with an externally generated reset pulse signal φR. In response to the signal φR, the reset transistor 6 switches ON and OFF to allow the information charges, sequentially accumulated at the source, to flow to the reset drain.

The first stage of output circuit 7 incorporates two transistors: a first DpNMOS transistor 7a and a first enhancement type NMOS transistor 7b connected in series between a power supply Vdd and ground. The second stage of output circuit 8 also incorporates two transistors: a second DpNMOS transistor 8a and a second enhancement type NMOS transistor 8b connected in series between the power supply Vdd and the ground. Both transistors 7a, 8a are characterized by a depletion type N channel MOS structure, a floating gate and a control gate as shown in FIG. 3.

The first DpNMOS transistor 7a, in the first stage of the output circuit 7, has a drain connected to the power supply Vdd, a gate connected to the source of the reset transistor 6 and a source connected to the gate of the second DpNMOS transistor 8a. The second DpNMOS transistor 8a, in the second stage of the output circuit 8, has a drain connected to the power supply Vdd and a source connected to an output terminal 10, where the video signal Yt is output.

The gates of the NMOS transistors 7b and 8b of the output circuits 7 and 8 are connected and supplied with a constant potential Vgg. The resistance produced by each of the NMOS transistor 7b and 8b is determined by the voltage Vgg. In effect, transistors 7b and 8b serve as load resistors for the DpNMOS transistors 7a and 8a, respectively.

The operation of the CCD solid state image pickup device will now be described. When the image pickup device is directed to a target, the individual photosensors generate information charges corresponding to the targeted image. The targeted image is then provided by the image sensing section 2 to the output circuit section 5 via the charge accumulating section 3, and then to the horizontal transfer section 4.

The information charges transferred to the output circuit section 5 are temporarily accumulated in the source of the reset transistor 6. This source effectively acts as a capacitor, which upon storing a charge q, exhibits a parasitic capacitance C. The source of the reset transistor 6 is connected to the control gate 28 of the first DpNMOS transistor 7a. Consequently, the voltage applied to the control gate 28 is set as the positive voltage $V_{G2}$. The level of voltage $V_{G2}$ is determined by the parasitic capacitance C and the amount of charges q (i.e., $V_{G2}$=q/C), and varies as a function of the amount of charges transferred from the individual light receiving pixels.

A current consistent with conditions producing voltage $V_{G2}$, flows through the first DpNMOS transistor 7a. Since the first NMOS transistor 7b functions as a resistor, the potential at a node N1, between the DpNMOS transistor 7a and the NMOS transistor 7b, is set at $V_{G2}$-$V_{T2}$, where $V_{G2}$ is the voltage applied to the control gate 28 of the DpNMOS transistor 7a, and where $V_{T2}$ is the threshold voltage of the transistor 7a. Since most of the current flowing through the channel of the DpNMOS transistor 7a flows at a level significantly under the channel, noise produced by the operation of the output circuit 7 can effectively be suppressed.

The potential at the node N1 is also applied to the control gate 28 of the second DpNMOS transistor 8a. Since the second NMOS transistor 8b functions as a resistor, the potential at a node N2 between the DpNMOS transistor 8a and the NMOS transistor 8b is set to the potential at the node N1 minus the threshold voltage $V_{T2}$ of transistor 8a. Again, because most of the current flowing through the channel of the DpNMOS transistor 8a flows significantly under the surface of the channel, noise generated by the transistor's operation can be effectively suppressed. The potential at the node N2 determines the potential level of the video signal Yt at the output terminal 10.

Given that a 10±1 volt fluctuation of voltage $V_{G2}$ occurs at the control gate 28, and that the threshold voltages of the DpNMOS transistors 7a, 8a are 0.8 volts, voltage fluctuation at node N1 is typically 9.2±1 volts. Likewise, the voltage fluctuation at the node N2 is 8.4±1 volts. Consequently, the voltage fluctuation of the video signal Yt is 8.4±1 volts.

The decreased operational noise levels exhibited by each of the transistor 7a and 7b is a distinct improvement from that of conventional image pickup device. Thus, according to the present invention, video signal output Yt, provided by output circuit section 5, is much less effected by noise than conventional designs. Put differently, video signal Yt, obtained by the image pickup device described in this embodiment, has an improved S/N ratio as compared with the conventional art.

The potential difference $V_{32}$ of the voltage source 32, shown in FIG. 4, has a value corresponding to the amount of charge accumulated in the floating gate 27. As the amount of accumulated charge there increases, the potential difference $V_{32}$ increases. This causes an increase in the apparent threshold voltages $V_{T2}$ of transistors 7a and 8a. Alternatively, as the charge accumulated in the floating gate 27 decreases, the apparent threshold voltages $V_{T2}$ of transistors 7a and 8a decrease.

Assume, for example, that the voltage $V_{G2}$ at the control gate 28 exhibits a fluctuation of 10±1 volts, and that sufficient charge is built up on the floating gate 27 to allow the 3 volt threshold voltage $V_{T2}$ to be reached for either DpNMOS transistor 7a or 8a. It follows that the source potential of the DpNMOS transistor 7a in the first stage of output circuit 7 would be 7±1 volts, i.e., $V_{G2}$-$V_{T2}$. The source potential of the DpNMOS 8a in the second stage of output circuit 8 would then be 4±1 volts.

When the solid state image pickup device is actually used, however, a capacitor is typically connected to the output terminal 10. This removes the DC component from the video signal, effectively causing signal Yt to be a ±1 volt AC signal at the output terminal 10. As such, video signal Yt would not be adversely affected by a change in the threshold voltage $V_{T2}$ of the DpNMOS transistor 7a or 8a. Likewise, the AC video signal Yt would remain uninfluenced by changes in the threshold voltage $V_{T2}$.

According to this embodiment, since the floating gate 27 of each of the DpNMOS transistors 7a and 8a is covered with the oxidation film 26, the charges will remain in each gate 27. Even if some of the charges escape from the gate area, hot electrons produced by the current flowing between the source and drain of each DpNMOS transistor 7a or 8a serve as replacement charges. Moreover, once saturated, the floating gate 27 will not degrade the performance of either the transistor 7a or 8a.

As mentioned above, the depletion type N channel MOS transistor, embodied by this invention, not only has an N type inversion layer 25, but also has a double-layer gate structure of the floating gate 27 and control gate 28. This design permits the depletion type NMOS transistor to be switched on by a positive gate voltage. Since the depletion type NMOS transistor uses a buried channel design, noise can easily be suppressed. Moreover, depletion type N channel MOS transistors, as described by the present invention, present a distinct advantage when used in the output circuit section of a solid state image pickup device. The output from such transistors, video signal Yt, is much less effected by noise and has a much better S/N ratio than output signals produced with conventional transistors.

Although only one embodiment of the present invention has been described herein, it should be apparent to those skilled in the art that the present invention may be embodied in many other specific forms without departing from the spirit or scope of the invention. Particularly, it should be understood that this invention may be embodied in the following forms.

The DpNMOS transistor according to this invention may be adapted for use in differential amplifiers constructed in the form of a current mirror.

This invention may be embodied in a depletion type P channel MOS transistor having a P type inversion layer. In this case, the floating gate of that transistor would store holes or positive charges instead of negative charges.

In the above-described embodiment, the area of the floating gate 27 may differ from that of the control gate 28. This invention may also be embodied in a DpNMOS transistor having a split gate structure where the floating gate and control gate are arranged side by side.

In the above-described embodiment, the two enhancement type NMOS transistors 7b and 8b, shown in FIG. 2, may be replaced with resistor elements.

Therefore, the present examples and embodiment are to be considered as illustrative and not restrictive and the invention is not to be limited to the details given herein, but may be modified within the scope of the appended claims.

What is claimed is:

1. A source follower type output circuit comprising:
a depletion type MOS transistor coupled to a resistor element, said depletion type MOS transistor comprising:
a drain region and a source region formed in distinct areas of a semiconductor substrate, said source region being connected to said resistor element, said source region serving as an output terminal of the source follower type output circuit;

an inversion layer formed in a surface area of said semiconductor substrate between said drain region and said source region;

a floating gate for storing a continuously maintained predetermined amount of charge, located above said semiconductor substrate and insulated from said inversion layer by an insulating layer, covering said inversion layer; and a control gate provided above said floating gate and insulated from said floating gate by said insulating layer;

wherein said drain region is connected to a first power supply terminal, said control gate serves as an input terminal of the source follower type output circuit for receiving an input signal, the voltage potential of the input signal required to allow current to flow across said drain region and said source region of said depletion type MOS transistor being the difference between a potential level of said floating gate and a threshold voltage of said depletion type MOS transistor, said potential level of said floating gate corresponding to an amount of charge accumulated in said floating gate, thereby hot electrons produced by said current flowing across said drain region and said source region maintain said continuously maintained predetermined amount of charge in said floating gate, wherein said resistor element is attached to a second power supply terminal, wherein said output terminal is connected between said depletion type MOS transistor and said resistor element, and wherein said resistor element, depletion type MOS transistor, input terminal, output terminal, first power supply terminal, and second power supply terminal define a source follower type output circuit.

2. A source follower type output circuit according to claim 1, wherein said resistor element includes an enhancement type MOS transistor.

3. A source follower type output circuit according to claim 2 wherein said enhancement type MOS transistor includes a gate supplied with a constant voltage.

4. A source follower type output circuit according to claim 1, wherein said floating gate and said control gate have substantially equal areas.

5. A source follower type output circuit according to claim 1, wherein said depletion type MOS transistor includes an N-type channel.

6. A source follower type output circuit for generating an output signal in response to an input signal represented by information charges, said source follower type output circuit comprising:

a resistor element having a first terminal and a second terminal;

a depletion type MOS transistor coupled to said first terminal of said resistor element, said depletion type MOS transistor comprising:

a semiconductor substrate;

a drain region formed in said semiconductor substrate;

a source region formed in an area of said semiconductor substrate distinct from said drain region, said source region connected to said resistor element and serving as an output terminal of said source follower type output circuit;

an inversion layer formed in a surface area of said semiconductor substrate between said drain region and said source region;

an insulating layer formed on said semiconductor substrate;

a floating gate for storing a continuously maintained predetermined amount of charge, said floating gate being located above said semiconductor substrate and insulated from said inversion layer by said insulating layer, said floating gate covering said inversion layer;

a control gate provided above and insulated from said floating gate by said insulating layer, said control gate serving as an input terminal of said source follower type output circuit for receiving the information charges representing the input signal;

a first power supply terminal connected to said drain region for applying a voltage potential across said drain region and said source region; and a second power supply terminal connected to said second terminal of said resistor element;

wherein said floating gate is responsive to said voltage potential for storing said continuously maintained predetermined amount of charge in said floating gate;

wherein a voltage potential of the first terminal of the resistor element is greater than a voltage potential of the second terminal of the resistor element;

wherein a voltage potential level of the input signal required to allow current to flow across said source region and said drain region being the difference between a potential level of said floating gate and a threshold voltage of said depletion type MOS transistor, the value of the voltage potential level of the input signal so required to allow the current flow across said drain region and said source region varying according to the amount of charge stored in said floating gate; and wherein said output terminal is connected between said depletion type MOS transistor and said resistor element.

7. A source follower type output circuit according to claim 6, wherein an amount of said accumulated charge in said floating gate is sufficient to render the threshold voltage of said depletion type MOS transistor positive so that a voltage potential level of said input signal required to allow current to flow across said source region and said drain region is a positive signal.

8. A source follower type output circuit according to claim 6, wherein said resistor element includes an enhancement type MOS transistor.

9. A source follower type output circuit according to claim 8, wherein said enhancement type MOS transistor includes a gate supplied with a constant voltage.

10. A source follower type output circuit according to claim 6, wherein said floating gate and said control gate have substantially equal areas.

11. A source follower type output circuit according to claim 6, wherein said depletion type MOS transistor includes an N-type channel.

12. A source follower type output circuit for generating an output signal in response to an input signal represented by information charges, said source follower type output circuit comprising:

a resistor element, wherein said resistor element is attached to a second power supply terminal;

a depletion type MOS transistor coupled to said resistor element, said depletion type MOS transistor comprising:

a semiconductor substrate;

a drain region formed in said semiconductor substrate;

a source region formed in an area of said semiconductor substrate distinct from said drain region, said source region connected to said resistor element and serving as an output terminal of said source follower type output circuit;

an inversion layer formed in a surface area of said semiconductor substrate between said drain region and said source region;

an insulating layer formed on said semiconductor substrate;

a floating gate for storing a continuously maintained predetermined amount of charge, said floating gate being located above said semiconductor substrate and insulated from said inversion layer by said insulating layer, said floating gate covering said inversion layer;

a control gate provided above and insulated from said floating gate by said insulating layer, said control gate serving as an input terminal of said source follower type output circuit for receiving the information charges representing the input signal;

said floating gate being capable of accumulating electrons from said drain region when a potential is applied across said drain region and said source region, said electrons creating said continuously maintained predetermined amount of charge in said floating gate;

a first power supply terminal connected to said drain region to apply a voltage potential across said drain region and said source region, the voltage potential being sufficient to create an amount of charge in said floating gate to allow a positive voltage level of said input signal at said control gate to induce current to flow across said drain region and said source region, wherein said drain region is at an AC signal ground potential; and an output terminal connected between said depletion type MOS transistor and said resistor element.

13. A source follower type output circuit according to claim 12, wherein:

said depletion type MOS transistor normally being responsive only to negative gate voltage potentials to cause current to flow between said drain region and said source region;

said amount of charge in said floating gate being effective to render said depletion type MOS transistor responsive to positive gate voltage potentials so that said depletion type MOS transistor may be substituted for an enhancement type MOS transistor which normally responds to positive gate voltage potentials to cause current to flow between said drain region and said source region.

* * * * *

UNITED STATES PATENT AND TRADEMARK OFFICE
CERTIFICATE OF CORRECTION

PATENT NO. : 5,912,483
DATED : June 15, 1999
INVENTOR(S) : HAMADA

It is certified that error appears in the above-identified patent and that said Letters Patent is hereby corrected as shown below:

On the title page, add the following:   Item [30]

Foreign Application Priority Data

Jul 5, 1994   [JP]   Japan   6-153941

Signed and Sealed this

Twenty-eighth Day of March, 2000

Attest:

Q. TODD DICKINSON

*Attesting Officer*        *Commissioner of Patents and Trademarks*